(12) United States Patent
Kulkarni et al.

(10) Patent No.: US 9,685,208 B2
(45) Date of Patent: *Jun. 20, 2017

(54) ASSIST CIRCUIT FOR MEMORY (71) Applicant: Intel Corporation, Santa Clara, CA (US)

(72) Inventors: Jaydeep P. Kulkarni, Portland, OR (US); Anupama Thaploo, Maricopa, AZ (US); Iqbal Rajwani, Roseville, CA (US); Kyung-Hoae Koo, Hillsboro, OR (US); Eric A. Karl, Portland, OR (US); Muhammad Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/094,755

(22) Filed: Apr. 8, 2016

(65) Prior Publication Data
US 2016/0225419 A1 Aug. 4, 2016

Related U.S. Application Data (63) Continuation of application No. 14/229,767, filed on Mar. 28, 2014, now Pat. No. 9,355,694.

(51) Int. Cl.
*G11C 7/00* (2006.01)
*G11C 7/12* (2006.01)
(Continued)

(52) U.S. Cl.
CPC .............. *G11C 7/12* (2013.01); *G11C 7/1048* (2013.01); *G11C 7/1069* (2013.01); *G11C 7/22* (2013.01);
(Continued)

(58) Field of Classification Search
CPC ........ G11C 7/1078; G11C 7/22; G11C 7/1006
(Continued)

(56) References Cited

U.S. PATENT DOCUMENTS 7,248,520 B2 7/2007 Kohno
7,768,308 B2 8/2010 Maede et al.
(Continued)

OTHER PUBLICATIONS

Boley, James; Analyzing Sub-Threshold Bitcell Topologies and the Effects of Assist Method of SRAM VMIN; Journal of Low Power Electronics and Applications, ISSN 2079-9268; Apr. 18, 2012; 12 pages.

(Continued)

*Primary Examiner* — Son Dinh
(74) *Attorney, Agent, or Firm* — Schwabe, Williamson & Wyatt, P.C.

(57) ABSTRACT

Embodiments include apparatuses, methods, and systems related to an assist circuit that may be coupled to one or more components of a memory system to selectively lower a supply voltage that is delivered to the component. For example, the assist circuit may be coupled to a plurality of bitcells (e.g., register file bitcells). The assist circuit may selectively lower the supply voltage delivered to the bitcells during at least a portion of a write operation and/or during an inactive state of the bitcells. Additionally, or alternatively, the assist circuit may be coupled to a read circuit to selectively lower the supply voltage delivered to the read circuit during an inactive state of the read circuit. The assist circuit may include a control transistor coupled in parallel with one or more diodes between a main supply rail and a supply node of the bitcells and/or read circuit.

21 Claims, 5 Drawing Sheets (51) Int. Cl.
*G11C 7/22* (2006.01)
*G11C 17/16* (2006.01)
*G11C 7/10* (2006.01)
*G11C 11/419* (2006.01)

(52) U.S. Cl.
CPC ............ *G11C 11/419* (2013.01); *G11C 17/16* (2013.01); *G11C 2207/005* (2013.01)

(58) Field of Classification Search
USPC .................. 365/189.16, 226, 189.15, 189.14
See application file for complete search history.

(56) References Cited

U.S. PATENT DOCUMENTS

| | | | |
|---|---|---|---|
| 8,111,579 B2 | 2/2012 | De et al. | |
| 8,164,938 B2 | 4/2012 | Kuroda et al. | |
| 8,659,936 B2* | 2/2014 | Chuang | G11C 11/413 365/154 |
| 9,355,694 B2* | 5/2016 | Kulkarni | G11C 7/12 |
| 2008/0117666 A1 | 5/2008 | Russell et al. | |
| 2010/0188909 A1 | 7/2010 | Kenkare et al. | |
| 2012/0170388 A1 | 7/2012 | Choi | |
| 2012/0243354 A1 | 9/2012 | Loh et al. | |
| 2012/0281457 A1 | 11/2012 | Behrends et al. | |
| 2012/0281458 A1 | 11/2012 | Teman et al. | |
| 2012/0307574 A1 | 12/2012 | Cheng et al. | |
| 2013/0003443 A1 | 1/2013 | Houston | |
| 2013/0077387 A1 | 3/2013 | Yabuuchi | |
| 2013/0141962 A1 | 6/2013 | Liaw | |
| 2013/0215689 A1 | 8/2013 | Joshi et al. | |

OTHER PUBLICATIONS

Chandra and Sharma; Write Assist in Low-Voltage SRAMS; White Paper—ARM Limited; May 2012; 8 pages.

International Search Report and Written Opinion mailed Jun. 4, 2015 for International Application No. PCT/US2015/018518, 13 pages.

* cited by examiner

Figure 6

ASSIST CIRCUIT FOR MEMORY

CROSS REFERENCE TO RELATED APPLICATION

This application is a continuation of U.S. patent application Ser. No. 14/229,767, entitled "ASSIST CIRCUIT FOR MEMORY," filed on Mar. 28, 2014, and claims priority to the Ser. No. 14/229,767 application. The Specification of the Ser. No. 14/229,767 application is incorporated herein by reference.

GOVERNMENT INTEREST

This invention was made with Government support under contract number FA8650-13-3-7338 awarded by the Department of Defense. The Government has certain rights in this invention.

FIELD

Embodiments of the present invention relate generally to the technical field of electronic circuits, and more particularly to an assist circuit for memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Register file arrays are commonly used for local storage in microprocessor cores. Many register file arrays use 8T bitcells (e.g., including 8 transistors). The 8T bitcells provide fast read and write operations and dual-port capability, and generally have lower Vmin (e.g., minimum Vcc) than 6T bitcells. However, as the transistor sizes are scaled smaller, the variation in the Vmin of the bitcells across process corners may increase.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Various embodiments provide an assist circuit that may be coupled to one or more components of a memory system to selectively lower a supply voltage that is delivered to the component. For example, the assist circuit may be coupled to a plurality of bitcells (e.g., register file bitcells). The assist circuit may selectively lower the supply voltage delivered to the plurality of bitcells during at least a portion of a write operation to provide a reduced write minimum voltage Vmin for the bitcells and/or to allow passgate transistors with higher threshold voltages to be used in the bitcells. Additionally, or alternatively, the assist circuit may selectively lower the supply voltage during an inactive state of the bitcells to reduce a leakage current of the bitcells and/or mitigate the impact of aging on the transistors of the bitcells.

In some embodiments, the assist circuit may additionally or alternatively be coupled to a read circuit that is coupled to the bitcells and/or to a read-only memory (ROM) circuit. The assist circuit may selectively lower a supply voltage delivered to the read circuit during an inactive state of the read circuit.

In various embodiments, the assist circuit may include one or more diodes (e.g., diode-connected transistors) coupled between a main supply rail and a supply node of the component to which the assist circuit is coupled (e.g., the bitcells and/or read circuit). The assist circuit may further include a transistor coupled in parallel with the one or more diodes between the main supply rail and the supply node. The transistor may receive a control signal to turn the transistor on or off to selectively lower the voltage at the supply node of the component.

Figure 1:
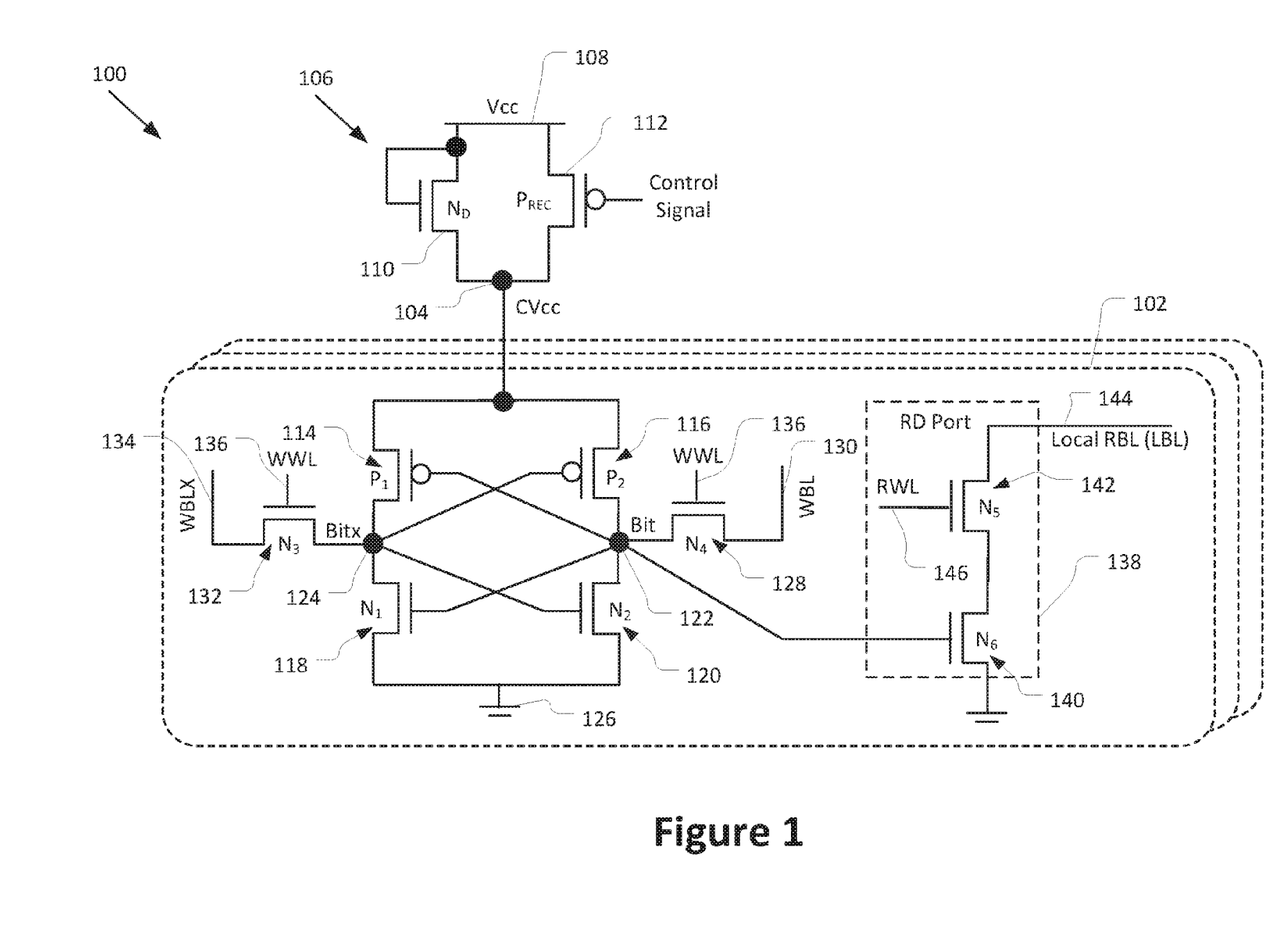
FIG. 1 illustrates a memory circuit including an assist circuit coupled to a plurality of register file bitcells in accordance with various embodiments.

FIG. 1 illustrates a memory circuit 100 in accordance with various embodiments. The memory circuit 100 may include a plurality of memory bitcells 102. The individual bitcells 102 may store one or more bits of data. The bitcells 102 may be coupled to a supply node 104 to receive a positive voltage. In various embodiments, an assist circuit 106 may be coupled between the supply node 104 and a main supply rail 108. The main supply rail 108 may receive a main supply voltage Vcc.

The assist circuit 106 may include a diode 110 coupled between the main supply rail 108 and the supply node 104. The diode 110 may be a diode-connected transistor, such as a diode-connected n-type metal-oxide-semiconductor (NMOS). The assist circuit 106 may further include a transistor 112 coupled in parallel with the diode 110 between the main supply rail 108 and the supply node 104. In some embodiments, the transistor 112 may be a p-type transistor, such as a p-type metal oxide semiconductor (PMOS), although other types of transistors may be used in other embodiments. The transistor 112 may receive a control signal to turn the transistor 112 on or off to selectively provide a conductive path between the main supply rail 108 and the supply node 104 via the transistor 112 (e.g., around the diode 110).

In various embodiments, the assist circuit 106 may be used to control a voltage, CVcc, at the supply node 104. For example, when the transistor 112 is turned off, the voltage CVcc may settle to a voltage level that is lower than the main supply voltage Vcc, for example, a voltage level approximately equal to the main supply voltage Vcc less the voltage drop provided by the diode 110 (e.g., the threshold voltage, Vt, of the diode 110). When the transistor 112 is turned on, the voltage CVcc at the supply node 104 may settle to a voltage level approximately equal to the main supply voltage Vcc. Accordingly, the assist circuit 106 may be used to selectively provide a voltage level at the supply node 104 that is less than the main supply voltage Vcc, as further discussed herein.

Figure 2:
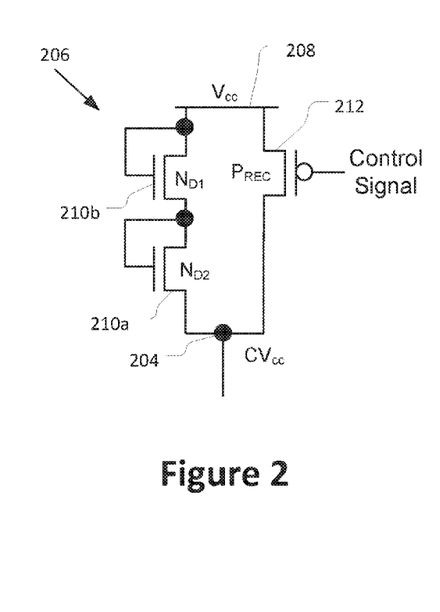
FIG. 2 illustrates another example assist circuit in accordance with various embodiments.

In some embodiments, the assist circuit 106 may include one or more additional diodes (e.g., diode-connected transistors) coupled in series with the diode 110 between the main supply rail 108 and the supply node 104. For example, FIG. 2 illustrates an assist circuit 206 including two diodes 210a-b coupled in series between a main supply rail 208 and a supply node 204. A transistor 212 may be coupled in parallel with the diodes 210a-b between the main supply rail 208 and the supply node 204. Other embodiments of the assist circuit 206 may include any suitable number of one or more diodes 210a-b. The number of diodes may be selected based on a desired voltage drop for the voltage CVcc at the supply node 204 compared with the main supply voltage Vcc at the main supply rail 208 when the transistor 212 is off.

Referring again to FIG. 1, in some embodiments, the bitcells 102 may be register file bitcells of a register file array. For example, the bitcells 102 may be 8T bitcells (e.g., including 8 transistors) as shown in FIG. 1. Other embodiments may include other types of bitcells. For example, bitcells with a plurality of read ports and/or write ports may be used in some embodiments.

As shown in FIG. 1, the bitcells 102 may include a pair of pull-up transistors (e.g., pull-up transistor 114 and pull-up transistor 116) and a pair of pull-down transistors (e.g., pull-down transistor 118 and pull-down transistor 120) arranged as cross-coupled inverters. For example, the drain terminal of the pull-up transistor 114 may be coupled to a drain terminal of the pull-down transistor 118, and the drain terminal of the pull-up transistor 116 may be coupled to the drain terminal of the pull-down transistor 120. Additionally, the gate terminals of the pull-up transistor 114 and the pull-down transistor 118 may be coupled to a bit node 122 between the pull-up transistor 116 and the pull-down transistor 120, and the gate terminals of the pull-up transistor 116 and the pull-down transistor 120 may be coupled to a complementary bit (bitx) node 124 between the pull-up transistor 114 and the pull-down transistor 118. The source terminals of the pull-up transistors 114 and 116 may be coupled to one another and to the supply node 104. The source terminals of the pull-down transistors 118 and 120 may be coupled to a ground terminal 126. In some embodiments, the pull-up transistors 114 and 116 may be PMOS transistors, and the pull-down transistors 118 and 120 may be NMOS transistors.

The individual bitcells 102 may store a value of a bit (e.g., a logic 1 or a logic 0) based on a voltage level at the bit node 122 between pull-up transistor 116 and pull-down transistor 120. For example, the bit node 122 may have a first voltage level (e.g., Vcc) to indicate that the bit has a logic 1, or a second voltage level (e.g., 0 volts or ground) to indicate that the bit has a logic 0. Additionally, the bitx node 124 between pull-up transistor 114 and pull-down transistor 118 may store a complementary bit (bitx) having the opposite logical value from the logical value of the bit stored at the bit node 122. Accordingly, the bitx node 124 may have the second voltage level when the bit node 122 has the first voltage level and may have the first voltage level when the bit node 122 has the second voltage level.

A passgate transistor 128 may be coupled between the bit node 122 and a write bit line (WBL) 130. Additionally, a passgate transistor 132 may be coupled between the bitx node 124 and a complementary write bit line (WBLX) 134. The gate terminals of the passgate transistors 128 and 132 may be coupled to a write word line (WWL) 136 to receive a WWL signal. The WWL signal may turn on the passgate transistors 128 and 132 during a write operation of the bitcell 102 and may turn off the passgate transistors 128 and 132 during an inactive state of the bitcell 102. During the write operation, the bitcell may write a bit to the bit node 122 based on a WBL signal received at the WBL 130. Additionally, the bitcell 102 may write a complementary bit to the bitx node 124 based on a WBLX signal received at the WBLX 134.

In some embodiments, the plurality of bitcells 102 coupled to the assist circuit 106 may be associated with a same block (e.g., a column) of a memory device. In some embodiments, the plurality of bitcells 102 coupled to the assist circuit 106 may all receive the same WWL signal. The memory device may include a plurality of blocks of bitcells, and separate assist circuits 106 may be coupled to the respective blocks of bitcells.

In some embodiments, the individual bitcells 102 may further include a read port 138 coupled to the bit node 122. The read port 138 may include NMOS transistors 140 and 142. A gate terminal of NMOS transistor 140 may be coupled to the bit node 122. The NMOS transistor 142 may be coupled between the NMOS transistor 140 and a local read bit line (LBL) 144. The gate terminal of the NMOS transistor 142 may be coupled to a read word line (RWL) 146 to receive a RWL signal. The RWL signal may selectively activate a read operation of the bitcell 102.

In various embodiments, the control signal may turn off the transistor 112 of the assist circuit 106 for at least a portion of the write operation of the bitcell 102. Turning off the transistor 112 may cause the voltage level at the supply node 104 to float. The supply node 104 may settle at a voltage level that is less than the main supply voltage Vcc by the threshold voltage Vt of the diode 110 (e.g., CVcc=Vcc−Vt). The lower voltage during the write operation may provide a lower write Vmin for the bitcell 102. Alternatively, the lower voltage during the write operation may allow the use of passgate transistors 128 and 132 with higher threshold voltages, thereby providing lower leakage current for the bitcell 102.

In some embodiments, the transistor 112 may be turned off for a first portion of the write operation and then turned on for a second portion of the write operation. During the first portion of the write operation, the lower voltage at the supply node 104 provided by the assist circuit 106 may reduce the drive strength of the pull-up transistors 114 and 116, thereby reducing the contention provided by the pull-up transistors 114 and 116 to the passgate transistors 132 and 128, respectively. The reduced contention may allow the value of the bit to be flipped (e.g., from a 0 to a 1 or from a 1 to a 0) at lower values of the main supply voltage Vcc than for circuits that do not include the assist circuit 106. Accordingly, the assist circuit 106 may reduce the write Vmin, which may correspond to a minimum value of the main supply voltage Vcc at which the bitcell 102 can reliably write data across process, voltage, and temperature (PVT) corners.

When the transistor 112 turns on during the second portion of the write operation, the voltage level at the supply node 104 may increase to be at or near the main supply voltage Vcc. This may cause the voltage level at the bit node 122 to rise to Vcc if the bit being written is a logic 1, or it may cause the voltage level at the bitx node 124 to rise to Vcc if the bit being written is a logic 0, thereby completing the transition.

Figure 3:
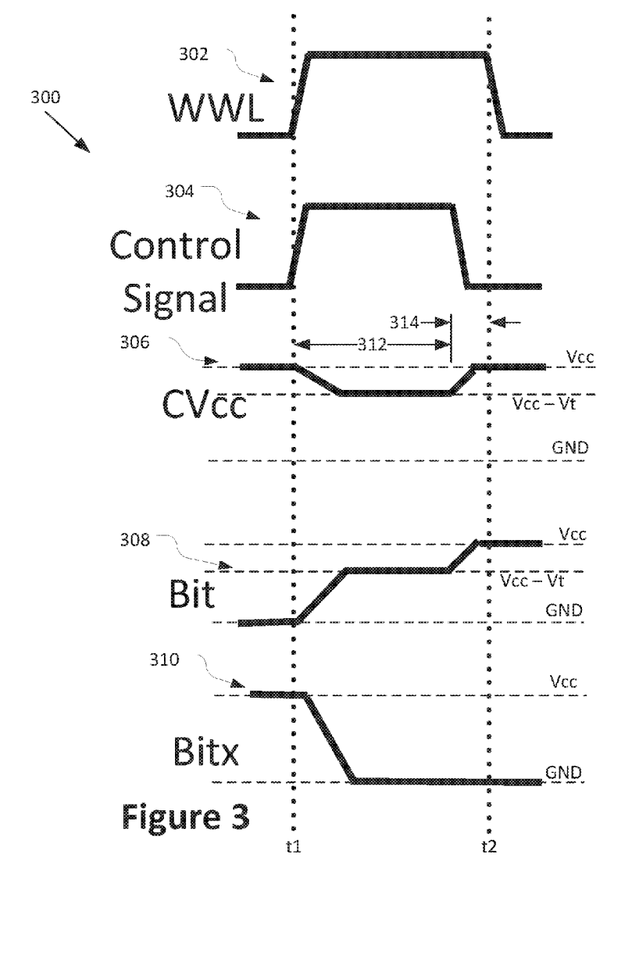
FIG. 3 illustrates a plurality of waveforms used by the memory circuit of FIG. 1, in accordance with various embodiments.

For example, FIG. 3 illustrates sample waveforms 300 that may be used by the memory circuit 100 of FIG. 1, for example, during a write operation to write a logic 1 bit to the bitcell 102, where the bitcell 102 previously stored a logic 0 bit. FIG. 3 shows a WWL signal 302 that may be received at the WWL 136 of bitcell 102, a control signal 304 that may be received at the gate terminal of the transistor 112 of the assist circuit 106, a CVcc voltage 306 at the supply node 104, a bit voltage 308 at the bit node 122, and a bitx voltage 310 at the bitx node 124. The CVcc voltage 306, bit voltage 308, and bitx voltage 310 are shown with respect to reference lines indicating the first voltage level Vcc and the second voltage level GND (ground). The write operation may start at a time t1, and may end at a time t2 after the time t1.

Prior to time t1, the control signal 304 may be at a first logic level and the transistor 112 may be on. Accordingly, the CVcc voltage 306 may be at Vcc, and the diode 110 may be off.

At time t1, the WWL signal 302 may transition from a logic low voltage to a logic high voltage to initiate the write operation. Additionally, the WBL signal (not shown in FIG. 3) may be a logic high voltage to write a logic 1 bit to the bit node 122 of the bitcell 102, and the WBLX signal (not shown in FIG. 3) may be a logic low voltage to write a logic 0 complementary bit (bitx).

In some embodiments, the control signal 304 may turn the transistor 112 off for a first time period 312 of the write operation, and may turn the transistor 112 on for a second time period 314 of the write operation that occurs later in time than the first time period 312. For example, the control signal 304 may transition from a logic low voltage to a logic high voltage at time t1 to turn off the transistor 112, and then transition back to the logic low voltage at the end of the first time period 312 to turn the transistor 112 on.

When the transistor 112 turns off at the beginning of the write operation, the CVcc voltage 306 at the supply node 104 may decrease since the diode 110 and the transistor 112 may be off. The CVcc voltage 306 may decrease until the diode 110 turns on (e.g., when the gate-source voltage Vgs of the diode 110 reaches the threshold voltage Vt of the diode 110). The CVcc voltage 306 may settle at a voltage level approximately equal to Vcc−Vt. Additionally, the bit voltage 308 may transition from ground to the CVcc voltage. As discussed above, the lower CVcc voltage 306 may reduce the drive strength of the pull-up transistors 114 and 116, which may provide a lower Vmin for the bitcell 102.

When the transistor 112 turns on during the second time period 314 of the write operation, the CVcc voltage 306 may increase to Vcc. The increased CVcc voltage 306 may cause the bit voltage 308 to increase to Vcc also, thereby completing the transition from the logic 0 bit to the logic 1 bit.

As discussed above, the reduced CVcc voltage 306 during the first time period 312 may provide a lower write Vmin for the bitcell 102 compared with prior memory circuits that do not include the assist circuit 106. Alternatively, the reduced CVcc voltage 306 during the first time period may allow the use of passgate transistors 128 and 132 with higher threshold voltages for a given write Vmin of the bitcell 102 compared with prior memory circuits that do not include the assist circuit 106.

In various embodiments, any suitable relative length of the first time period 312 and/or second time period 314 may be used. In some embodiments, a relative length of the first time period 312 and/or second time period 314 may be selected to provide the decreased write Vmin and/or allow for passgate transistors 128 and 132 with higher threshold voltages, while also complying with a phase delay requirement for the bitcell 102. For example, in some embodiments, a length of the second time period 314 may be about 0% to about 90% of a length of the write operation, such as about 10% to about 40% of the length of the write operation. In other embodiments, the transistor 112 of the assist circuit 106 may be off for the entire length of the write operation (e.g., the length of the second time period 314 may be 0% of the length of the write operation). The length of the write operation may correspond to a length of time that the WWL signal 302 has the logic high voltage before transitioning back to the logic low voltage (e.g., t2−t1).

In various embodiments, in addition to or instead of turning the transistor 112 off for at least a portion of the write operation of the bitcell 102, the assist circuit 106 may turn the transistor 112 off during an inactive state of the plurality of bitcells 102. During the inactive state, new data may not be written to the bitcells 102. In some embodiments, data may also not be read from the bitcells 102 during the inactive state (e.g., in embodiments in which the assist circuit 106 is also coupled to a read circuit, as further discussed below with respect to FIG. 4).

With the transistor 112 off, the supply node 104 may be powered via the diode 110, and the CVcc voltage may be lower than the Vcc voltage at the main supply rail 108. The steady state CVcc voltage during the inactive state may be based on the leakage current of the bitcells 102 and the threshold voltage of the diode 110. The lower CVcc voltage provided by the assist circuit 106 may reduce the aging impact on the transistors of the bitcells 102.

The transistors of the bitcells 102, especially the PMOS pull-up transistors 114 and 116 may degrade over time, which may degrade the retention Vmin of the bitcells 102. The impact on aging may be mitigated by turning off the transistor 112 of the assist circuit 106 during the inactive state of the bitcells 102. Additionally, the lower CVcc voltage provided by the assist circuit 106 may significantly reduce the leakage current of the bitcells 102 (e.g., in the write port of the bitcells 102 including the passgate transistors 128 and 132). For example, in simulations of one embodiment, the reduced CVcc voltage provided by the assist circuit 106 reduced the leakage current of the bitcell 102 by about 45%. When passgate transistors 128 and 132 of higher threshold voltage were used in the bitcell 102, the leakage savings increased to about 62%.

Figure 4:
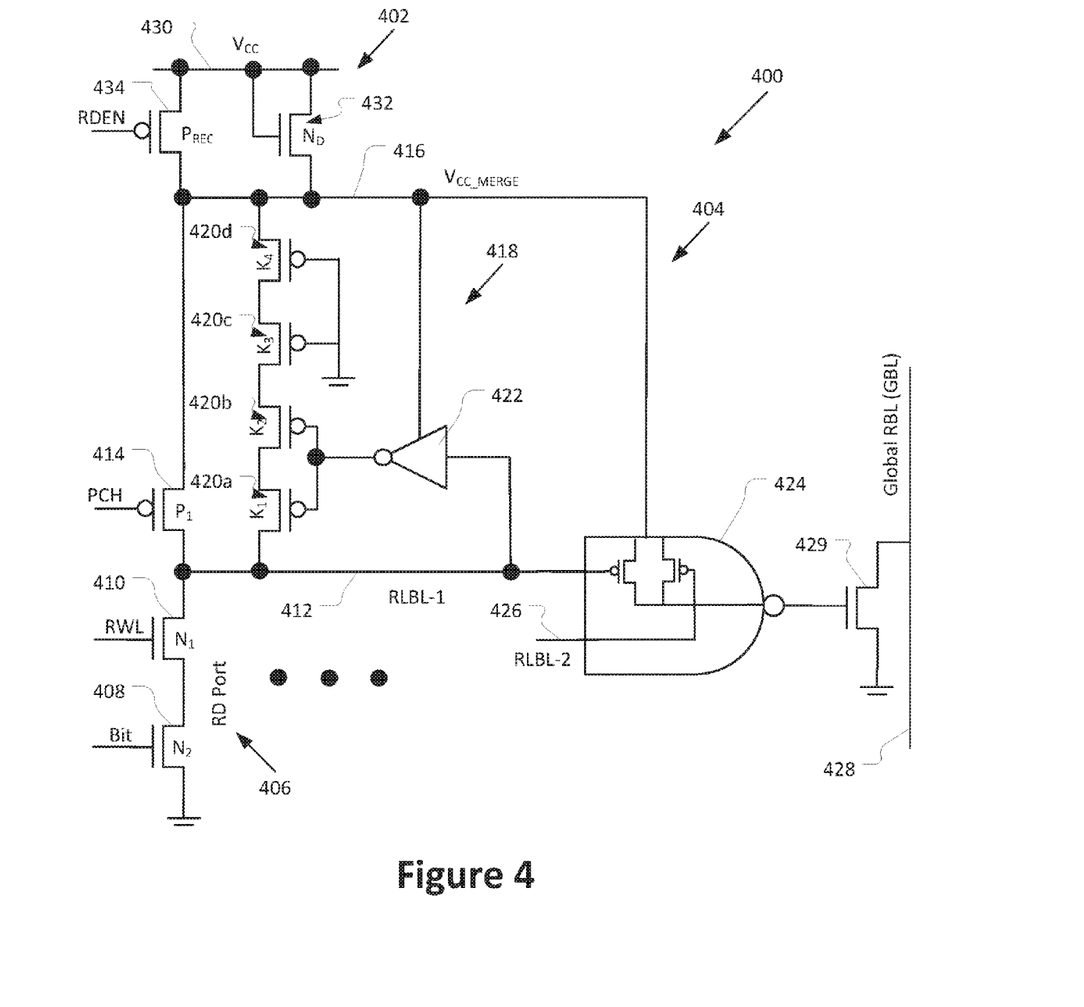
FIG. 4 illustrates an assist circuit coupled to a read circuit, in accordance with various embodiments.

In some embodiments, the assist circuit 106 discussed herein may be coupled to other components of a memory system to selectively lower the supply voltage delivered to the components of the memory system. For example, FIG. 4 illustrates a circuit 400 including an assist circuit 402 coupled to a read circuit 404 in accordance with various embodiments. The read circuit 404 may be coupled to a plurality of read ports 406 of respective bitcells. The read ports 406 may correspond to the read ports 138 of bitcells 102 in some embodiments.

The read port 406 may include NMOS transistors 408 and 410. A gate terminal of the NMOS transistor 408 may be coupled to a bit node of the bitcell to receive a bit signal. The NMOS transistor 410 may receive a read word line (RWL) signal at the gate terminal of the NMOS transistor 410 to selectively activate a read operation of the read circuit 404. During the read operation, the RWL signal may turn on the NMOS transistor 410 to pass the bit signal to a read local bit line 412 (RLBL-1).

One or more pre-charge transistors 414 may be coupled between the read local bit line 412 and a supply node 416 (also referred to as a read supply node 416). Additionally, the read circuit 404 may include domino keeper logic 418 coupled in parallel with the one or more pre-charge transistors 414 between the read local bit line 412 and the supply node 416. The domino keeper logic 418 may include one or more keeper transistors 420a-d and a feedback inverter 422 coupled to one another as shown.

The read circuit 404 may further include merge logic 424 (e.g., a negated AND (NAND) gate) with inputs coupled to the read local bit line 412 and another read local bit line 426 (RLBL-2) associated with another set of bitcells to merge the read local bit lines 412 and 426. The merge logic 424 may also be powered by the supply node 416. An output of the merge logic 424 may be passed to a global read bit line (GBL) 428 (e.g., via a transistor 429). The global read bit line 428 may be coupled to sense circuitry (not shown) to determine the values of the bits read on the read local bit lines 412 and 426.

In various embodiments, the assist circuit 402 may be coupled between a main supply rail 430 and the supply node 416. The main supply rail 430 may receive a main supply voltage Vcc. In some embodiments, the assist circuit 402 may be the same as assist circuit 106 shown in FIG. 1. That is, the assist circuit 402 may also be coupled to the plurality of bitcells to selectively lower the CVcc voltage passed to the bitcells. In other embodiments, a separate assist circuit 402 may be used for the read circuit 404 than the assist circuit 106 used for the bitcells 102. The assist circuit 402 may include a diode 432 (e.g., a diode-connected transistor) and a transistor 434 (e.g., a PMOS transistor). The transistor 434 may receive a control signal at the gate terminal of the transistor 434 to turn the transistor 434 on or off.

In various embodiments, the control signal may turn the transistor 434 off during an inactive state of the read circuit 404, and may turn the transistor 434 on during an active state of the read circuit 404. Data may be read from one or more of the bitcells associated with the read circuit 404 during the active state, and data may not be read from the bitcells during the inactive state. During the active state, a Vcc_merge voltage at the supply node 416 may be approximately equal to the Vcc voltage at the main supply rail 430. Accordingly, data may be read using the read circuit 404 without interference from the assist circuit 402.

During the inactive state, the Vcc_merge voltage may be lower than the Vcc voltage at the main supply rail 430. The lower Vcc_merge voltage may provide lower leakage current and reduced aging degradation for the read circuit 404. The read circuit 404 may be placed in the inactive state, for example, when the bitcells associated with the read circuit 404 are not selected for reading of data.

In embodiments when the same assist circuit 402 is coupled to the read circuit 404 to provide the Vcc_merge voltage and to the bitcells to provide the CVcc voltage, the read circuit may be placed in the inactive state when the bitcells associated with the read circuit 404 are not selected for reading or writing of data. In these embodiments, when data is written to the bitcells, the control signal may control the transistor 434 of the assist circuit 402 as described herein for the write operation.

In some embodiments, an assist circuit (e.g., the assist circuit 402 or another assist circuit) may be additionally or alternatively coupled to the global read bit line 428 to selectively reduce the voltage level on the global read bit line 428 when data is not being read by the read circuit 404.

Figure 5:
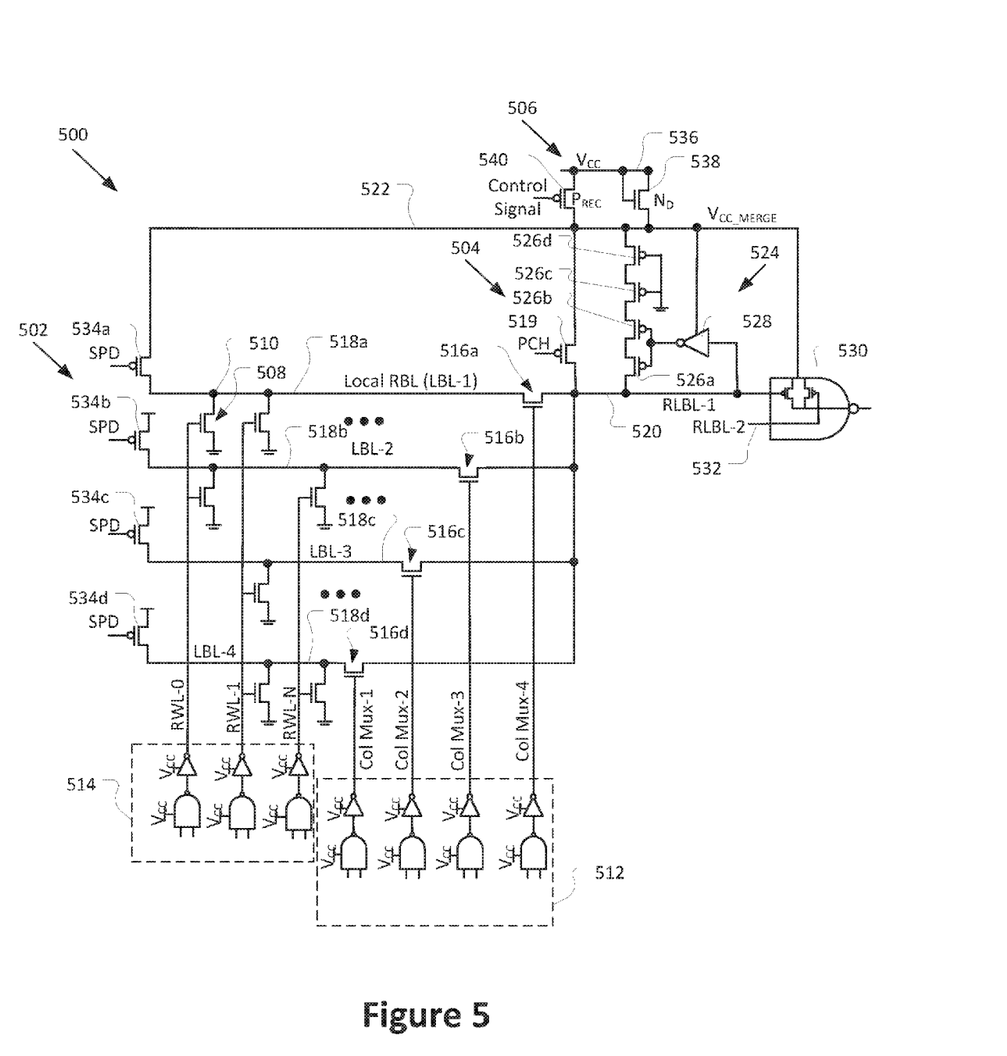
FIG. 5 illustrates an assist circuit coupled to a read-only memory (ROM) circuit in accordance with various embodiments.

FIG. 5 illustrates a circuit 500 including a ROM circuit 502, a read circuit 504, and an assist circuit 506 in accordance with various embodiments. The ROM circuit 502 may include a plurality of ROM cells 508. Data may be written to the ROM cells 508 using vias coupled with nodes 510. ROM circuit 502 may further include multiplexing circuitry 512 and RWL circuitry 514. The multiplexing circuitry 512 may control transistors 516a-d coupled to respective local bit lines 518a-d (e.g., LBL-1, LBL-2, LBL-3, or LBL-4) to select a local bit line from which to read data. A ROM cell 508 from the selected local bit line 518a-d may be activated for reading using the RWL circuitry 514.

The read circuit 504 may include one or more pre-charge transistors 519 coupled between a read local bit line 520 (RLBL-1) and a supply node 522. The read local bit line 520 may be coupled to the local bit lines 518a-d via respective transistors 516a-d. The read circuit 504 may further include domino keeper logic 524 coupled in parallel with the one or more pre-charge transistors 519 between the read local bit line 520 and the supply node 522. The domino keeper logic 524 may include one or more keeper transistors 526a-d and a feedback inverter 528 coupled to one another as shown.

The read circuit 504 may further include merge logic 530 (e.g., a NAND gate) with inputs coupled to the read local bit line 520 and another read local bit line 532 (RLBL-2) associated with another ROM circuit of ROM cells. An output of the merge logic 530 may be passed to a global bit line (not shown). The global bit line may be coupled to sense circuitry to determine the values of the bits read on the read local bit lines 520 and 532.

In some embodiments, the circuit 500 may further include secondary pre-charge devices (SPDs) 534a-d coupled between respective local bit lines 518a-d and the supply node 522.

In various embodiments, the assist circuit 506 may be coupled between a main supply rail 536 and the supply node 522. The main supply rail 536 may receive a main supply voltage Vcc. The assist circuit 506 may include a diode 538 (e.g., a diode-connected transistor) and a transistor 540 (e.g., a PMOS transistor). The transistor 540 may receive a control signal at the gate terminal of the transistor 540 to turn the transistor 540 on or off.

In various embodiments, the control signal may turn the transistor 540 off during an inactive state of the read circuit 504 and/or ROM circuit 502, and may turn the transistor 540 on during an active state of the read circuit 504 and/or ROM circuit 502. Data may be read from the ROM circuit 506 during the active state, and data may not be read from the ROM circuit 506 during the inactive state. During the active state, a Vcc_merge voltage at the supply node 522 may be approximately equal to the Vcc voltage at the main supply rail 536. Accordingly, data may be read from the ROM circuit 502 using the read circuit 504 without interference from the assist circuit 506.

During the inactive state, the Vcc_merge voltage at the supply node 522 may be lower than the Vcc voltage at the main supply rail 536. The lower Vcc_merge voltage may provide lower leakage current and reduced aging degradation for the read circuit 504. The read circuit 504 may be placed in the inactive state, for example, when the ROM cells 508 associated with the ROM circuit 502 are not selected for reading of data.

Figure 6:
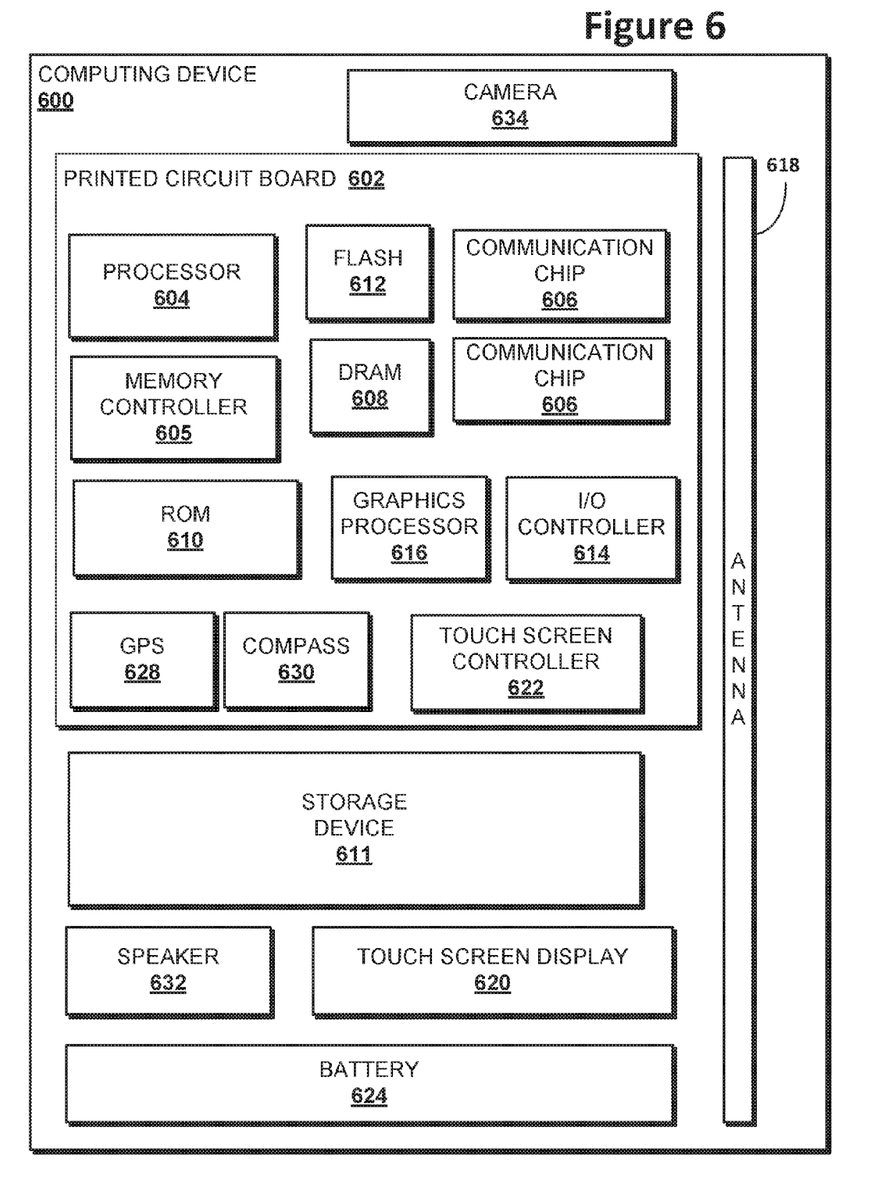
FIG. 6 illustrates an example system configured to employ the apparatuses and methods described herein, in accordance with various embodiments.

FIG. 6 illustrates an example computing device 600 that may employ the apparatuses and/or methods described herein (e.g., circuit 100, circuit 206, waveforms 300, circuit 400, circuit 500), in accordance with various embodiments. As shown, computing device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computing device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computing device 600 may include other components that may or may not be physically and electrically coupled to the PCB 602. These other components include, but are not limited to, memory controller 605, volatile memory (e.g., dynamic random access memory (DRAM) 608), non-volatile memory such as read-only memory (ROM) 610, flash memory 612, and storage device 611 (e.g., a hard-disk drive (HDD)), an input/output (I/O) controller 614, a digital signal processor (not shown), a crypto processor (not shown), a graphics processor 616, one or more antenna 618, a display (not shown), a touch screen display 620, a touch screen controller 622, a battery 624, an audio codec (not shown), a video codec (not shown), a global positioning system (GPS) device 628, a compass 630, an accelerometer (not shown), a gyroscope (not shown), a speaker 632, a camera 634, and a mass storage device (such as hard disk drive, a solid state drive, compact disk (CD), digital versatile disk (DVD)) (not shown), and so forth. In various embodiments, the processor 604 may be integrated on the same die with other components to form a System on Chip (SoC).

In some embodiments, the one or more processor(s), flash memory 612, and/or storage device 611 may include associated firmware (not shown) storing programming instructions configured to enable computing device 600, in response to execution of the programming instructions by one or more processor(s) 604, to practice all or selected aspects of the methods described herein (e.g., the de-emphasis process and/or impedance compensation process). In various embodiments, these aspects may additionally or alternatively be implemented using hardware separate from the one or more processor(s) 604, flash memory 612, or storage device 611.

In various embodiments, one or more components of the computing device 600 may include the circuit 100, 206, 400, and/or 500 described herein. For example, the circuit 100, 206, 400, and/or 500 may be included in processor 604, I/O controller 614, memory controller 605, and/or another component of computing device 600.

The communication chips 606 may enable wired and/or wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 702.20, General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 600 may be any other electronic device that processes data.

Some Non-Limiting Examples are Provided Below.

Example 1 is a memory circuit comprising: a supply node; one or more memory bitcells coupled to the supply node, the one or more memory bitcells to receive a write word line (WWL) signal to selectively activate a write operation for the memory cells; and an assist circuit coupled between a main supply rail and the supply node, the main supply rail to receive a main supply voltage and the assist circuit to selectively provide a first voltage to the supply node during at least a portion of the write operation, the first voltage being lower than the main supply voltage.

Example 2 is the memory circuit of Example 1, wherein the assist circuit includes: a diode coupled between the main supply rail and the supply node; and a transistor coupled in parallel with the diode between the main supply rail and the supply node, the transistor to receive a control signal to turn the transistor on or off to selectively provide a conductive path between the main supply rail and the supply node via the transistor.

Example 3 is the memory circuit of Example 2, wherein the diode is a first diode, and wherein the assist circuit further includes one or more diodes coupled in series with the first diode between the main supply rail and the supply node.

Example 4 is the memory circuit of Example 1, wherein individual bitcells of the one or more bitcells include a pair of pull-up transistors, and wherein the supply node is coupled to and between the pull-up transistors.

Example 5 is the memory circuit of any one of Examples 1 to 4, wherein the assist circuit is to provide the first voltage to the supply node during a first time period of the write operation and is to provide a second voltage to the supply node during a second time period of the write operation, the second voltage being greater than the first voltage and the second time period occurring later in time than the first time period.

Example 6 is the memory circuit of Example 5, wherein a length of the second time period is about 10% or more of a length of the write operation.

Example 7 is the memory circuit of Example 1, wherein the assist circuit is to selectively lower a voltage level at the supply node to be less than the main supply voltage during an inactive state of the one or more bitcells.

Example 8 is the memory circuit of Example 1, wherein the one or more bitcells are coupled to a local read line, wherein the memory circuit further includes a read circuit coupled to the local read line to read data stored by the one or more bitcells during a read operation of the read circuit, and wherein the assist circuit or another assist circuit is further coupled to a read supply node of the read circuit to selectively lower a voltage at the read supply node during an inactive state of the read circuit.

Example 9 is a memory apparatus comprising: a memory to store data; a read circuit coupled to the memory to read the data during a read operation of the read circuit, the read circuit including a read supply node; and an assist circuit coupled to the read supply node. The assist circuit includes: a diode coupled between a main supply rail and the read supply node, the main supply rail to receive a main supply voltage; and a transistor coupled in parallel with the diode between the main supply rail and the read supply node, the transistor to receive a control signal to turn the transistor on or off to selectively provide a conductive path between the main supply rail and the supply node via the transistor.

Example 10 is the memory apparatus of Example 9, wherein the assist circuit is to turn on the transistor of the assist circuit during the read operation of the read circuit, and to turn off the transistor of the assist circuit during at least a portion of an inactive mode of the assist circuit to lower a voltage level at the read supply node during the inactive mode.

Example 11 is the memory apparatus of Example 9, wherein the memory includes a register file array having a plurality of register file bitcells.

Example 12 is the memory apparatus of Example 11, wherein the read circuit is coupled to read ports of the respective register file bitcells.

Example 13 is the memory apparatus of Example 11, wherein the plurality of register file bitcells are coupled to a local read bit line, wherein the read circuit is coupled to the local read bit line, and wherein the read circuit includes one or more pre-charge transistors and keeper logic coupled between the local read bit line and the read supply node.

Example 14 is the memory apparatus of Example 9, wherein the memory includes a read-only memory (ROM) circuit.

Example 15 is the memory apparatus of any one of Examples 9 to 13, wherein the memory includes a plurality of bitcells, wherein the assist circuit is further coupled to a supply node of the plurality of bitcells, and wherein the assist circuit is to turn off the transistor of the assist circuit during an inactive state of the plurality of bitcells and is to turn on the transistor of the assist circuit during at least a portion of an active mode of the plurality of bitcells.

Example 16 is the memory apparatus of Example 15, wherein a write operation is performed by one or more of the bitcells in the active mode, and wherein the assist circuit is to turn the transistor off during a first time period of the write operation and is to turn the transistor on during a second time period of the write operation, the second time period occurring later in time than the first time period.

Example 17 is a computing system, comprising: a processor; a supply node; a register file array coupled to the processor and to the supply node, the register file array including a plurality of bitcells to store respective bits of data; and an assist circuit coupled to the supply node to deliver a bitcell supply voltage to the plurality of bitcells via the supply node. The assist circuit includes: a diode coupled between a main supply rail and the supply node, the main supply rail to receive a main supply voltage; and a transistor coupled in parallel with the diode between the main supply rail and the supply node, the transistor to receive a control signal to turn the transistor on or off to selectively provide a conductive path between the main supply rail and the supply node via the transistor.

Example 18 is the system of Example 17, wherein the diode is a first diode, and wherein the assist circuit further includes one or more diodes coupled in series with the first diode between the main supply rail and the supply node.

Example 19 is the system of Example 17, wherein individual bitcells of the plurality of bitcells include a pair of pull-up transistors, and wherein the supply node is coupled to and between the pull-up transistors.

Example 20 is the system of Example 17, wherein the bitcells are to receive a write word line (WWL) signal to selectively activate a write operation for the bitcells, and wherein the control signal is to turn the transistor off during a first time period of the write operation and is to turn the transistor on during a second time period of the write operation, the second time period occurring later in time than the first time period.

Example 21 is the system of Example 20, wherein a length of the second time period is about 10% or more of a length of the write operation.

Example 22 is the system of any one of Examples 17 to 20, wherein the control signal is to turn the transistor off during an inactive state of the bitcells to cause a voltage level at the supply node to be less than a voltage level of the main supply voltage during the inactive state.

Example 23 is the system of any one of Examples 17 to 20, wherein the bitcells are coupled to a local read line, wherein the system further includes a read circuit coupled to the local read line to read data stored by the bitcells during a read operation of the read circuit, and wherein the assist circuit is further coupled to a read supply node of the read circuit.

Example 24 is the system of Example 23, wherein the assist circuit is to turn on the transistor of the assist circuit during the read operation of the read circuit.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A memory circuit comprising:
   a supply node;
   a bitcell coupled to the supply node, the bitcell to receive a write word line (WWL) signal to selectively activate a write operation for the bitcell;
   an assist circuit coupled between a main supply rail and the supply node, the assist circuit including:
      a diode coupled between the main supply rail and the supply node; and
      a transistor coupled in parallel with the diode between the main supply rail and the supply node, the transistor to turn off, responsive to a control signal, for a first time period of the write operation and to turn on, responsive to the control signal, for a second time period of the write operation after the first time period.

2. The memory circuit of claim 1, wherein a voltage level of the supply node during the first time period is less than a voltage level of the supply node during the second time period.

3. The memory circuit of claim 1, wherein the bitcell is a first bitcell, and wherein the memory circuit includes a plurality of bitcells, including the first bitcell, that are coupled with the supply node to receive electrical power.

4. The memory circuit of claim 1, wherein the diode is a first diode, and wherein the memory circuit further includes a plurality of diodes, including the first diode, coupled in series with one another between the main supply rail and the supply node.

5. The memory circuit of claim 1, wherein the diode is a diode-connected transistor.

6. The memory circuit of claim 1, wherein the bitcell includes a pair of pull-up transistors, and wherein the supply node is coupled to and between the pull-up transistors.

7. The memory circuit of claim 1, wherein a length of the second time period is 10% to 40% of a length of the write operation.

8. The memory circuit of claim 1, wherein the transistor is further to be off during an inactive state of the bitcell to enable the supply node to receive a voltage from the main supply rail via the diode during the inactive state.

9. The memory circuit of claim 1, wherein the bitcell is coupled to a local read line, wherein the memory circuit further includes a read circuit coupled to the local read line to read data stored by the bitcell during a read operation of the read circuit, and wherein the assist circuit or another assist circuit is coupled to a read supply node of the read circuit to selectively lower a voltage at the read supply node during an inactive state of the read circuit.

10. The memory circuit of claim 1, wherein the WWL signal is to have a same voltage level during the first and second time periods of the write operation.

11. A memory apparatus comprising:
    means to provide, to a supply node that is coupled with a memory bitcell, a first voltage during a first time period of a write operation that is performed on the memory bitcell; and
    means to provide, to the supply node, a second voltage during a second time period of the write operation, wherein the second voltage is greater than the first voltage and the second time period occurs after the first time period.

12. The memory apparatus of claim 11, further comprising means to provide a write word line (WWL) signal with a first logic value during the first and second time periods of the write operation.

13. The memory apparatus of claim 11, wherein the bitcell is a first bitcell, and wherein the memory apparatus includes a plurality of bitcells, including the first bitcell, that are coupled with the supply node to receive electrical power.

14. The memory apparatus of claim 11, wherein the bitcell includes a pair of pull-up transistors, and wherein the supply node is coupled to and between the pull-up transistors.

15. The memory apparatus of claim 11, wherein a length of the second time period is 10% to 40% of a length of the write operation.

16. A computing system comprising:
    a processor;
    a network interface coupled to the processor; and
    a memory coupled to the processor, the memory including:
       a main supply rail to receive a main supply voltage;
       a supply node;
       a plurality of memory bitcells coupled to the supply node, the plurality of memory bitcells to receive a write word line (WWL) signal having a first logic value during a write operation for the memory bitcells; and
       an assist circuit coupled between the main supply rail and the supply node, the assist circuit to provide a reduced voltage to the supply node for a first portion of the write operation and to provide the main supply voltage to the supply node for a second portion of the write operation, wherein the reduced voltage is less than the main supply voltage and wherein the second portion occurs after the first portion.

17. The system of claim 16, wherein the assist circuit includes:
- a diode coupled between the main supply rail and the supply node; and
- a transistor coupled in parallel with the diode between the main supply rail and the supply node, the transistor to turn off for the first portion of the write operation and to turn on for the second portion of the write operation.

18. The system of claim 17, wherein the diode is a first diode, and wherein the assist circuit includes a plurality of diodes, including the first diode, coupled in series between the main supply rail and the supply node.

19. The system of claim 16, wherein individual bitcells of the plurality of bitcells include a pair of pull-up transistors, and wherein the supply node is coupled to and between the pull-up transistors.

20. The system of claim 16, wherein a length of the second portion of the write operation is 10% to 40% of a length of the write operation.

21. The system of claim 16, wherein the assist circuit is further to provide the reduced voltage to the supply node when the plurality of bitcells are in an inactive state.

\* \* \* \* \*